(12) United States Patent
Yamashita et al.

(10) Patent No.: US 11,333,969 B2
(45) Date of Patent: May 17, 2022

(54) IMPRINT APPARATUS, IMPRINT METHOD, AND ARTICLE MANUFACTURING METHOD

(71) Applicants: CANON KABUSHIKI KAISHA, Tokyo (JP); CANON NANOTECHNOLOGIES, INC., Austin, TX (US); KABUSHIKI KAISHA TOSHIBA, Tokyo (JP)

(72) Inventors: Keiji Yamashita, Utsunomiya (JP); Yutaka Watanabe, Shioya-gun (JP); Takuya Kono, Kanagawa-ken (JP); Masayuki Hatano, Kanagawa-ken (JP); Ikuo Yoneda, Mie-ken (JP)

(73) Assignees: CANON KABUSHIKI KAISHA, Tokyo (JP); CANON NANOTECHNOLOGIES, INC., Austin, TX (US); KABUSHIKI KAISHA TOSHIBA, Tokyo (JP)

( * ) Notice: Subject to any disclaimer, the term of this patent is extended or adjusted under 35 U.S.C. 154(b) by 82 days.

(21) Appl. No.: 16/190,588

(22) Filed: Nov. 14, 2018

(65) Prior Publication Data

US 2019/0101824 A1    Apr. 4, 2019

Related U.S. Application Data

(62) Division of application No. 14/322,254, filed on Jul. 2, 2014, now abandoned.

(30) Foreign Application Priority Data

Jul. 12, 2013  (JP) .................................. 2013-146018

(51) Int. Cl.
    *G03F 7/00*  (2006.01)
(52) U.S. Cl.
    CPC ................... *G03F 7/0002* (2013.01)

(58) Field of Classification Search
    CPC ............................ G03F 7/0002; G03F 7/0005
    See application file for complete search history.

(56) References Cited

U.S. PATENT DOCUMENTS

| 4,033,059 A | * | 7/1977 | Hutton | ................... | B41M 3/148 |
| | | | | | 283/91 |
| 7,360,851 B1 | | 4/2008 | Snyder | | |

(Continued)

FOREIGN PATENT DOCUMENTS

| JP | 2010183106 A | 8/2010 |
| JP | 2011228619 A | 11/2011 |
| JP | 2012069762 A | 4/2012 |

OTHER PUBLICATIONS

Peng, C., 2010. Novel mold fabrication methods for nanoimprint lithography and some applications of nanostructures in optics and electronics. Princeton University. https://search.proquest.com/docview/520466093?pq-origsite=gscholar (Year: 2010).*

(Continued)

*Primary Examiner* — Nicholas R Krasnow
(74) *Attorney, Agent, or Firm* — Rossi, Kimms & McDowell LLP

(57) ABSTRACT

Provided is an imprint apparatus that applies a resin (drops) dispersed at a plurality of locations on a substrate, brings the resin and a mold into contact, and transfers the contoured pattern that is formed in the mold to the resin comprising: a controller that sets a principal axis direction according to the contoured pattern and an array direction in which a plurality of resin drops are aligned, and determines application positions for the resin such that the array direction is angled with respect to the principal axis direction; and a dispenser that applies the resin based on the application positions that have been determined.

8 Claims, 10 Drawing Sheets

(56) References Cited

U.S. PATENT DOCUMENTS

| | | | |
|---|---|---|---|
| 8,485,123 B2 | 7/2013 | Dijksman et al. | |
| 8,679,357 B2 | 3/2014 | Wakamatsu et al. | |
| 9,804,503 B2* | 10/2017 | Tanaka | G03F 7/7035 |
| 2003/0080450 A1* | 5/2003 | Taniguchi | G02B 6/0065 |
| | | | 264/2.5 |
| 2005/0270312 A1* | 12/2005 | Lad | B41J 3/28 |
| | | | 347/1 |
| 2007/0172967 A1 | 7/2007 | Katagiri et al. | |
| 2007/0228593 A1* | 10/2007 | Jones | B82Y 40/00 |
| | | | 264/40.4 |
| 2008/0018875 A1* | 1/2008 | Schram | B82Y 40/00 |
| | | | 355/67 |
| 2009/0026657 A1* | 1/2009 | Nimmakayala | G03F 9/7049 |
| | | | 264/293 |
| 2009/0115110 A1* | 5/2009 | Schumaker | B82Y 40/00 |
| | | | 264/401 |
| 2009/0267268 A1* | 10/2009 | Yoneda | B82Y 10/00 |
| | | | 264/319 |
| 2010/0097590 A1* | 4/2010 | Schumaker | G03F 7/0002 |
| | | | 355/53 |
| 2010/0098859 A1* | 4/2010 | Schumaker | B82Y 40/00 |
| | | | 427/256 |
| 2010/0193994 A1* | 8/2010 | Wuister | B82Y 10/00 |
| | | | 264/293 |
| 2011/0033672 A1* | 2/2011 | Yang | B82Y 10/00 |
| | | | 428/195.1 |
| 2011/0143271 A1* | 6/2011 | Koshiba | B82Y 40/00 |
| | | | 430/30 |
| 2012/0208327 A1 | 8/2012 | Matsuoka | |
| 2012/0258292 A1* | 10/2012 | Lenhert | G01N 21/47 |
| | | | 428/201 |
| 2013/0004669 A1* | 1/2013 | Mataki | B82Y 10/00 |
| | | | 427/277 |
| 2013/0010020 A1* | 1/2013 | Kodama | B82Y 40/00 |
| | | | 347/10 |
| 2013/0020281 A1* | 1/2013 | Wakamatsu | G03F 7/0002 |
| | | | 216/40 |
| 2013/0120485 A1* | 5/2013 | Kodama | B41J 2/04543 |
| | | | 347/14 |
| 2013/0147096 A1 | 6/2013 | Yang et al. | |
| 2013/0213930 A1* | 8/2013 | Wakamatsu | B05D 3/12 |
| | | | 216/41 |
| 2015/0017329 A1 | 1/2015 | Fletcher et al. | |
| 2015/0234287 A1* | 8/2015 | Tanaka | G03F 7/0002 |
| | | | 355/27 |

OTHER PUBLICATIONS

Office Action issued in Japanese Appln. No. 2013-146018 dated May 23, 2017. English translation provided.

Office Action issued in Japanese Appln. No. 2013-146018 dated Feb. 6, 2018. English translation provided.

Office Action issued in U.S. Appl. No. 14/322,254 dated Jul. 19, 2017.

Office Action issued in U.S. Appl. No. 14/322,254 dated Nov. 22, 2017.

Office Action issued in U.S. Appl. No. 14/322,254 dated Jun. 14, 2018.

* cited by examiner

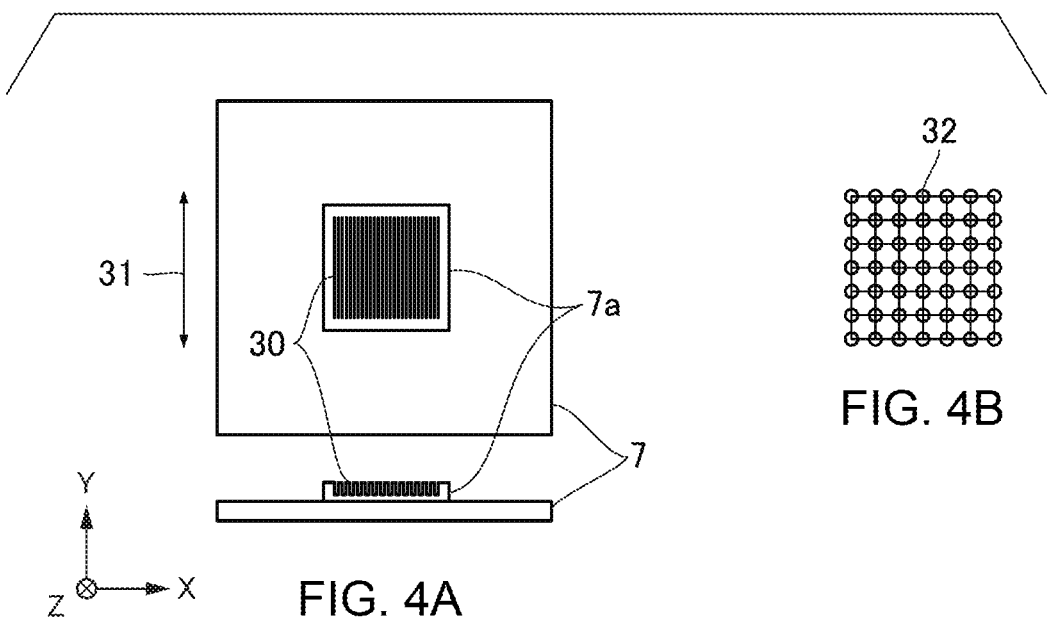
FIG. 4A
FIG. 4B
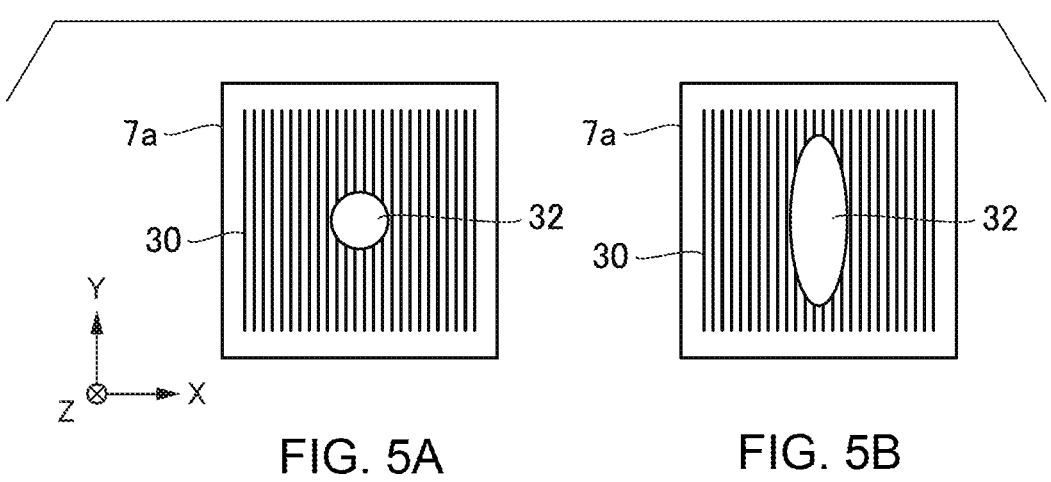
FIG. 5A
FIG. 5B

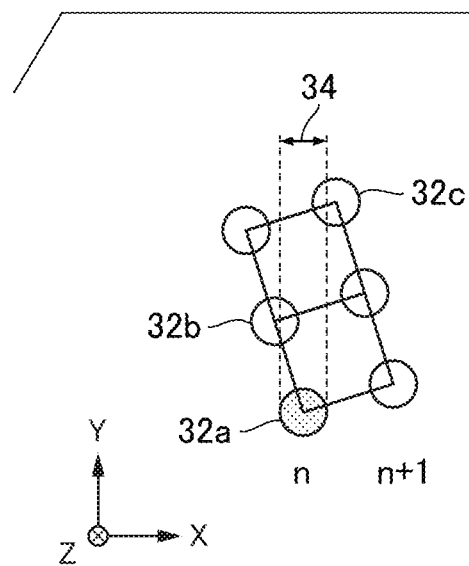 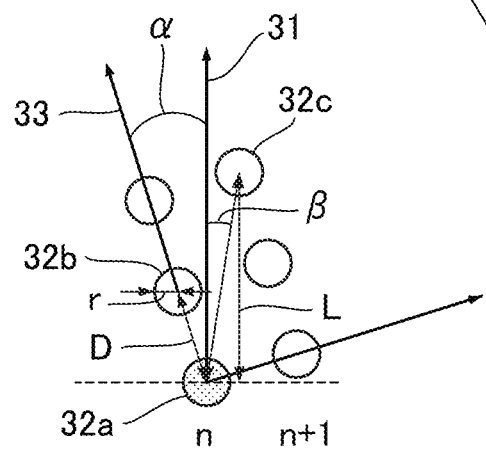
FIG. 8A    FIG. 8B
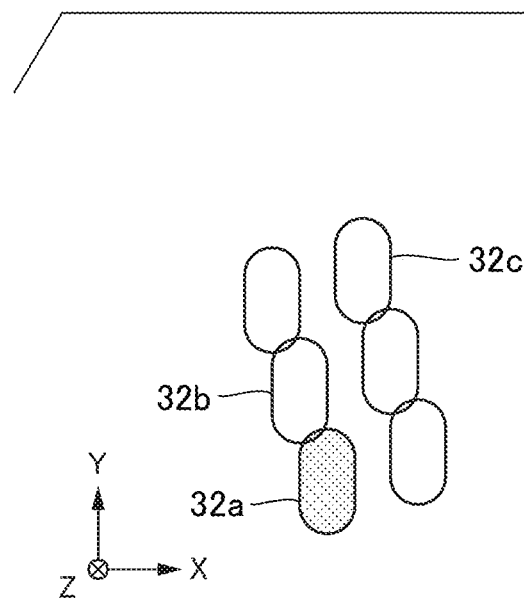 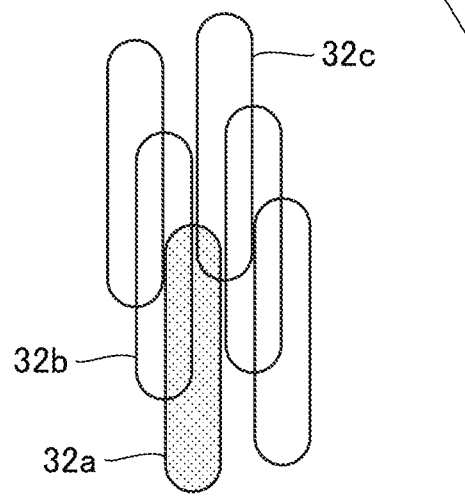
FIG. 9A    FIG. 9B

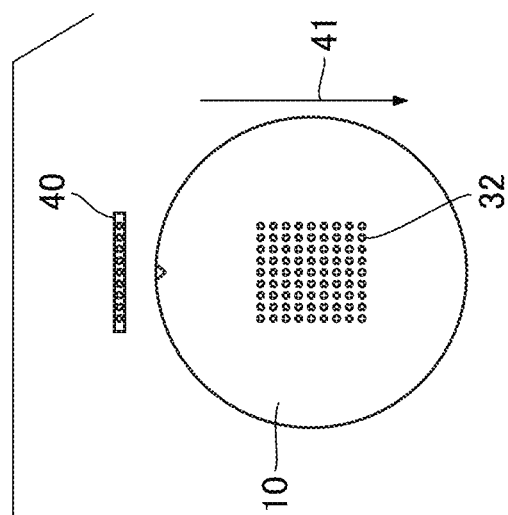
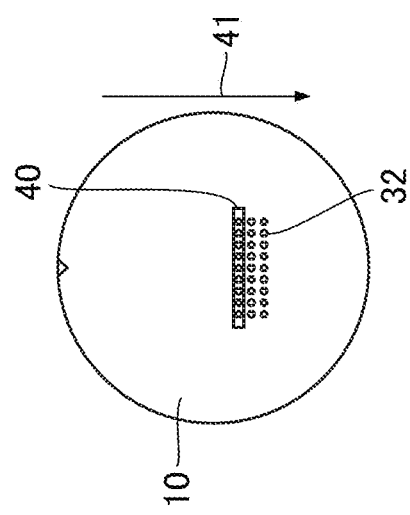
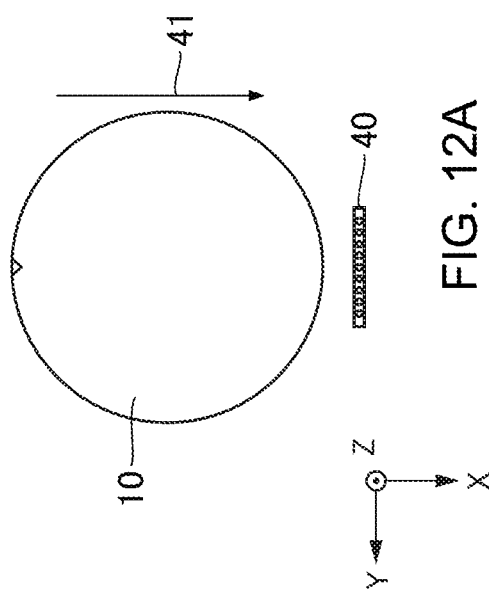
FIG. 12C
FIG. 12B
FIG. 12A

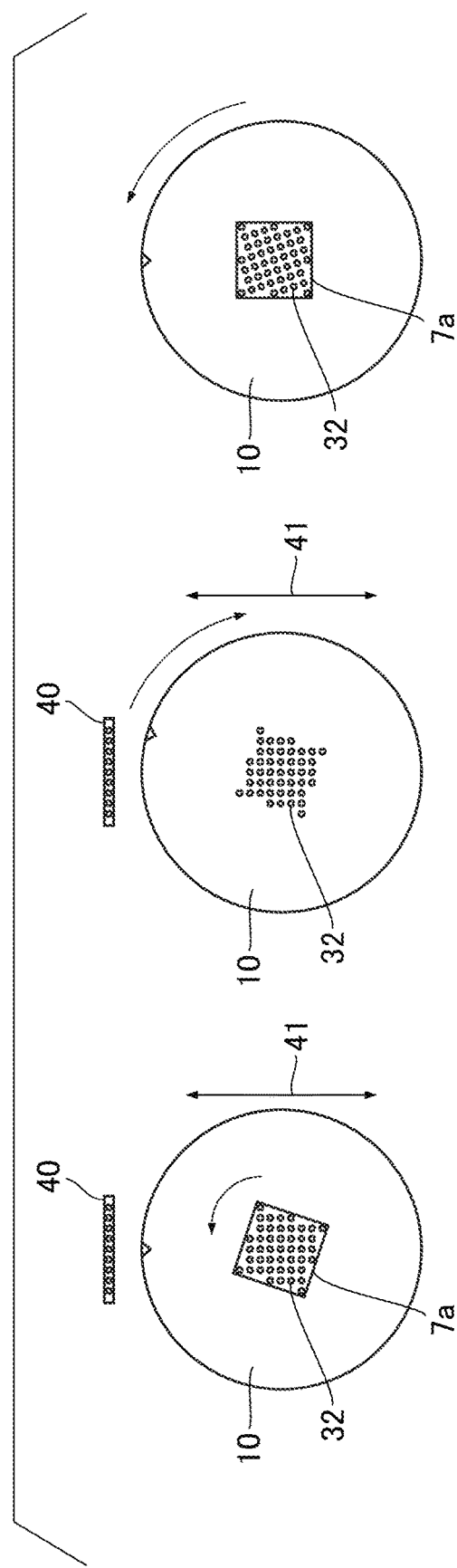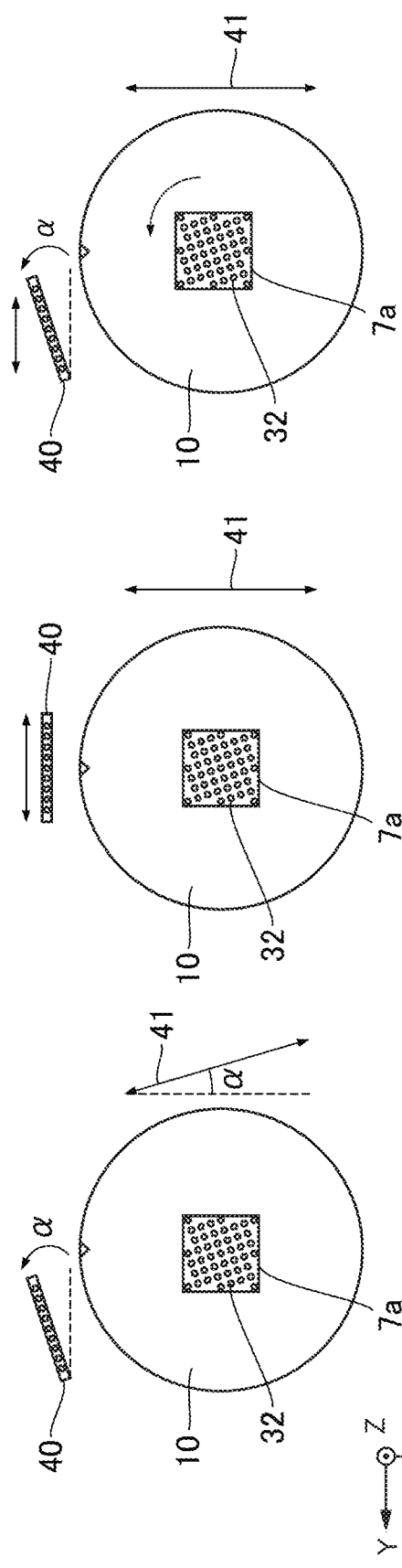

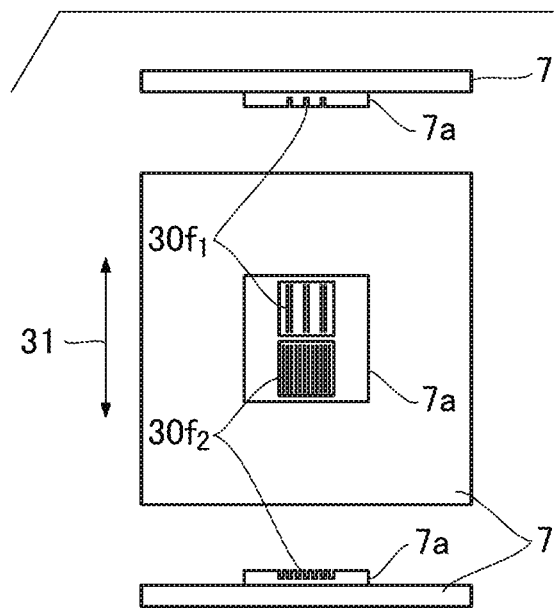 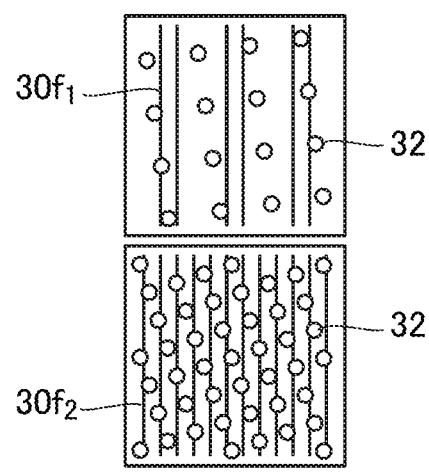
FIG. 14A  FIG. 14B
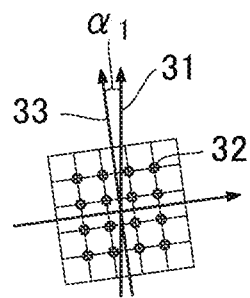 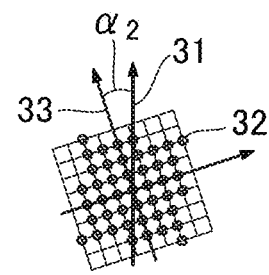
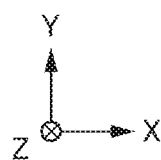
FIG. 14C  FIG. 14D

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

The demand for micronization of semiconductor devices, magnetic recording media, and MEMS and the like is increasing, and in addition to the conventional photolithography technology, a microfabrication technology in which an uncured resin on a substrate is molded by using a mold and a resin pattern is formed on the substrate is gaining attention. This technology is called "imprint technology", and a fine structure on the order of several nanometers can be formed on a substrate. One example of an imprint technology is a photo-curing method. In an imprint apparatus that uses this photo-curing method, first, an ultraviolet light-cured resin (imprint material, photo-cured resin) is applied to a shot, which is an imprint area on a substrate (wafer). Next, this resin (photo-cured resin) is molded by using a mold. In addition, by separating the resin after curing the resin by irradiating ultraviolet light, a resin pattern is formed on the substrate. In addition to this photo-curing method, there is also, for example, a heat-curing method in which, after molding a heat-cured resin on a substrate by using a mold, heat is applied, and the resin is separated after being cured to form a resin pattern.

In such an imprint apparatus, from the point of view of increasing the throughput, preferably, during the pressing of the mold and the resin on a substrate, the resin is quickly filled into a fine contoured pattern that is formed in the mold. At the same time, when using this imprint apparatus to manufacture, for example, a semiconductor device, the minimum line width of the circuit pattern is equal to or less than 100 nm, and in order to fill the resin reliably into the contoured pattern formed in a mold that satisfies this line width requirement, the resin must have a low viscosity. In this context, the imprint apparatus normally uses a step and repeat method, and repeats the pattern forming and the step movement for each shot on the substrate. At this time, because the resin has a low viscosity, applying in advance a resist (in this case, the resin) to all shots on the substrate as is done, for example, in an exposure apparatus, becomes difficult. Thus, in an imprint apparatus, generally the resin is applied (dropped) onto the shot using an inkjet method for each pattern to be formed on each shot, that is, each time the mold and resin are pressed together. However, with an inkjet method, when the resin that has been applied to the substrate and the mold are pressed together, bubbles easily become trapped in the uncured resin between the mold and the substrate. When the resin is cured with bubbles being retained as-is in this manner, there is a possibility that unfilled portions will occur in the resin pattern to be formed. Thus, as a countermeasure to suppress the occurrence of such unfilled portions, the specification of U.S. Pat. No. 7,360,851 discloses an imprint technology in which locations at which bubbles remain are specified by monitoring the spread of the resin during pressing with a camera, and the amount of drops of resin at this location is made large.

The imprint technology disclosed in U.S. Pat. No. 7,360,851 is one in which the application positions originally set are not changed, and the amount of drops of resin at locations at which bubbles are retained is made large. However, when the application position is not changed and the amount of resin is made large, there is a possibility that the evenness of the remaining film thickness after the imprint will be affected. That is, in the setting of the application positions, preferably the occurrence of unfilled portions should be suppressed beforehand.

SUMMARY OF THE INVENTION

The present invention provides an imprint apparatus that is advantageous for, for example, suppressing the occurrence of portions of the contoured pattern of the mold that are unfilled by resin and increasing the throughput.

According to an aspect of the present invention, an imprint apparatus that applies a resin dispersed at a plurality of locations on a substrate, brings the resin and a mold into contact, and transfers the contoured pattern that is formed in the mold to the resin comprising: a controller that sets a principal axis direction according to the contoured pattern and an array direction in which a plurality of resin drops are aligned, and determines application positions for the resin such that the array direction is angled with respect to the principal axis direction; and a dispenser that applies the resin based on the application positions that have been determined.

Further features of the present invention will become apparent from the following description of exemplary embodiments with reference to the attached drawings.

BRIEF DESCRIPTION OF THE DRAWINGS

FIGS. 4A and 4B are drawings that show the form of a contoured pattern and a conventional disposition of drops.

FIGS. 5A and 5B are drawings that show the filling behavior of one certain drop during pressing.

FIGS. 8A and 8B are drawings that show the determination method of an angle α when the array direction is tilted.

FIGS. 9A and 9B are drawings that show the filling behavior of six drops in the first embodiment.

FIG. 12A to 12C are drawings that show the conventional resin application operation in a time sequence.

FIG. 13A to 13 F are drawings that show a plurality of examples of the application operation in the first embodiment.

FIG. 14A to 14D are drawings that show the form of the contoured pattern and the disposition of drops in a second embodiment.

DESCRIPTION OF THE EMBODIMENTS

Hereinafter, preferred embodiments of the present invention will be described with reference to the drawings.

First Embodiment

Figure 1:
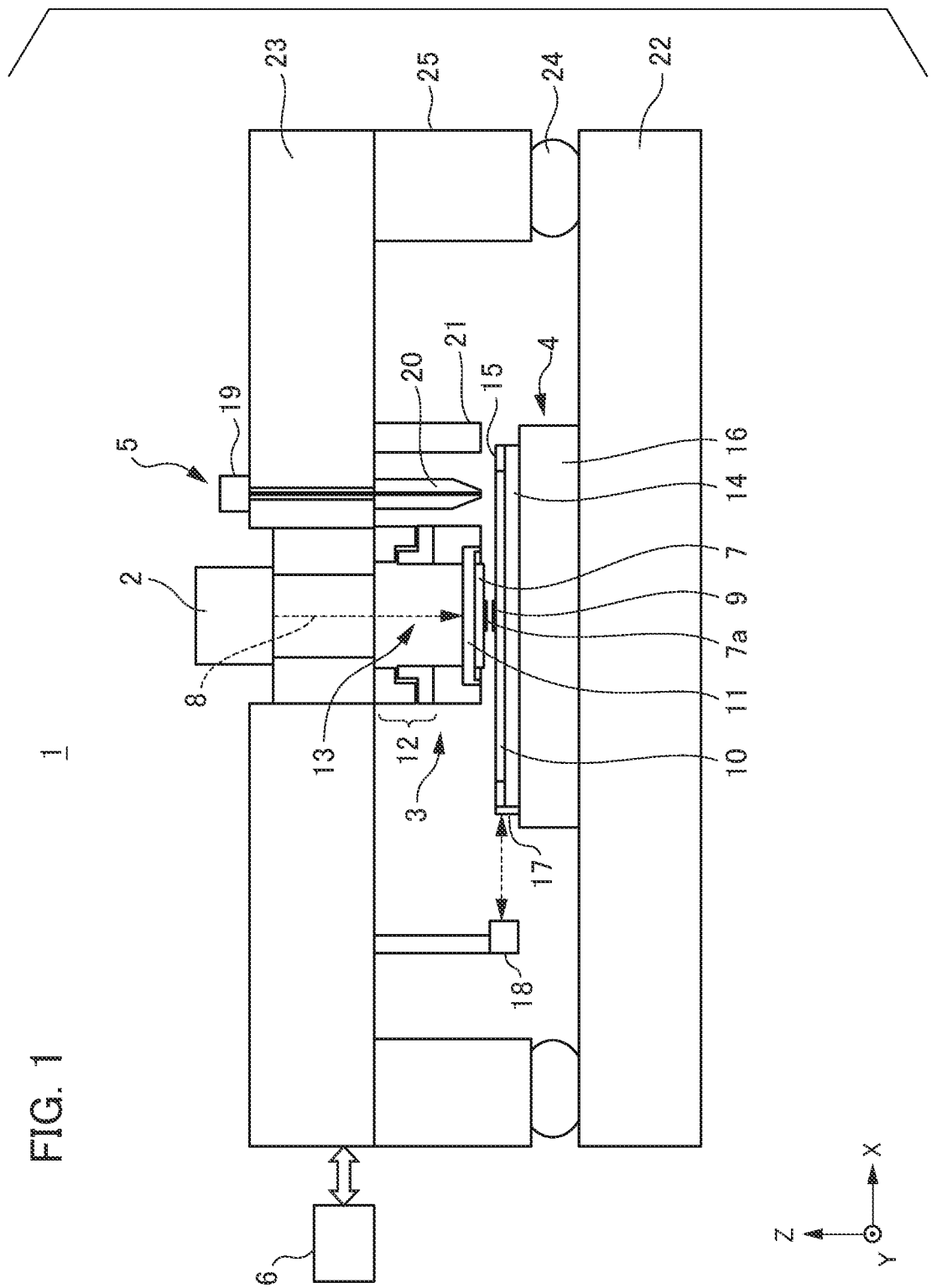
FIG. 1 is a drawing that shows the configuration of an imprint apparatus according to a first embodiment of the present invention.

First, an imprint apparatus according to a first embodiment of the present invention will be explained. FIG. 1 is a schematic view that shows the configuration of an imprint apparatus 1 according to the present embodiment. The imprint apparatus 1 is an apparatus that is used in the manufacture of devices such as semiconductor devices as an article, wherein molding is carried out by bringing into contact an uncured resin that has been applied to a wafer (substrate) and a mold, and a resin pattern is formed on a wafer. Note that in this case, this is assumed to be an imprint apparatus that uses a photo-curing method. In addition, in the attached drawings, the Z axis is parallel to the optical axis of the irradiation system that irradiates the resin on the wafer with ultraviolet light, and the X axis and Y axis are mutually perpendicular in a plane perpendicular to the Z axis. First, the imprint apparatus 1 is provided with a light irradiation unit 2, a mold holding mechanism 3, a wafer stage 4, a dispenser 5, and a controller 6.

The light irradiation unit 2 irradiates ultraviolet light 8 onto the mold 7 during the imprint treatment. This light irradiation unit 2 includes, although not illustrated, a light source and an illumination optical system that adjusts the ultraviolet light 8 that is emitted from this light source to light that is suitable for imprinting, and irradiates the mold 7. The light source can use lamps such as a mercury lamp, but this is not particularly limiting provided that the light can pass through the mold 7 and the light source emits light having a wavelength by which the resin (an ultraviolet light cured resin) 9, described below, is cured. The illumination optical system can include lenses, mirrors, apertures, or shutters for switching between irradiation and shielding. Note that in the present embodiment, although a light irradiation unit 2 is arranged in order to use a photo-curing method, in the case in which, for example, a heat curing method is used, a heat source for curing a heat-cured resin is arranged instead of this light irradiation unit 2.

The mold 7 has an outer peripheral shape that is polygonal (preferably, a rectangle or square), and includes a pattern portion 7a on which, for example, a contoured pattern that is to be transferred, such as a circuit pattern, is formed three-dimensionally at the surface opposed to the wafer 10. Note that there are various pattern sizes depending on the article that is the object of manufacture, but in fine articles, a pattern of tens of nanometers is also included. In addition, the material of the mold 7 preferably allows ultraviolet light 8 to pass and has a low thermal expansion rate, and can be, for example, fused silica. Furthermore, the mold 7 may include, on the surface that is irradiated by ultraviolet light 8, a cavity for which a flat part is a circle and having a certain depth.

Figures 2A, 2B, 2C:
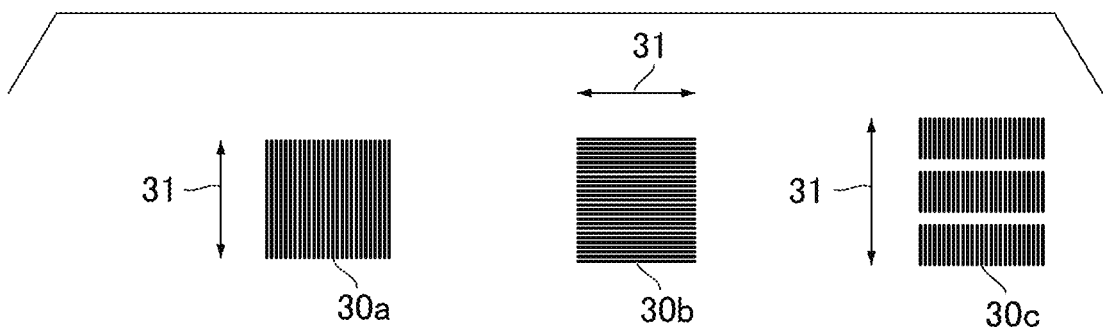
FIG. 2A to 2E are drawings that show an example of the form of a contoured pattern that is present in the pattern portion of a mold.
Figures 2D, 2E:
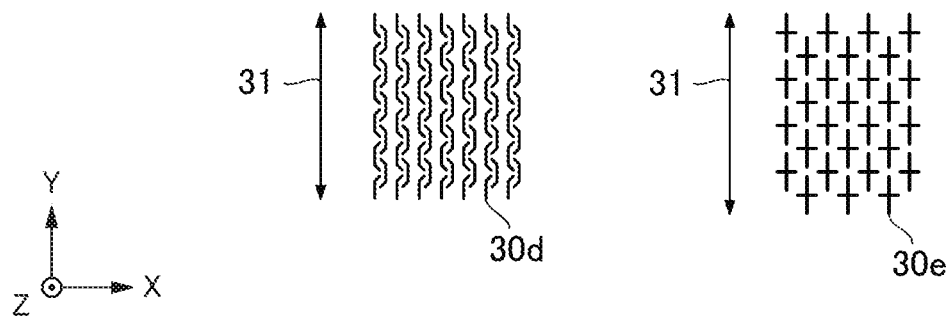

Here, as a reference, the form of a contoured pattern that can be formed by the pattern portion 7a will be explained. FIG. 2A to 2E are plan views that show examples of the forms of the contoured pattern 30. First, the contoured pattern 30a that is shown in FIG. 2A is one in which the principal axis direction is the Y axis direction. Here, the term "principal axis direction" denotes the direction in which fine recessed portions extend, and specifically, when the resin 9 is filled in the contoured pattern 30 that is formed in the pattern portion 7a, this is the direction in which the resin 9 readily flows. Next, the contoured pattern 30b that is shown in FIG. 2B is one for which the principal axis direction 31 is in the X axis direction. Next, the contoured pattern 30c that is shown in FIG. 2C is one for which the principal axis direction 31 is in the Y axis direction, and the fine recessed portions are divided at a plurality of locations. Next, the contoured pattern 30d that is shown in FIG. 2D is one for which the fine recessed portions include a plurality of curved portions in the direction of the plane. In this case, if the length of the recessed portions in the Y axis direction is long in comparison to the length in the X axis direction, the principal axis direction 31 of the contoured pattern 30d is in the Y axis direction. In addition, the contoured pattern 30e that is shown in FIG. 2E is one in which the fine recessed portions intersect in a cross form. In this case as well, if the length of the recessed portions in the Y axis direction is long in comparison to the length of the X axis direction, the principal axis direction 31 of the contoured pattern 30e is the Y axis direction.

The mold holding mechanism 3 includes a mold chuck 11 that holds the mold 7, a mold driving mechanism 12 that holds this mold chuck 11 so as to freely move, and, although not illustrated, a magnification correction mechanism that corrects the form of the mold 7 (pattern portion 7a). The mold chuck 11 can hold the mold 7 by attracting the outer peripheral area of the surface of the mold 7 that is irradiated by the ultraviolet light 8 by using a vacuum suction force or an electrostatic force. In the case in which the mold 7 is held, for example, by a vacuum suction force, the mold chuck 11 can adjust the suction force (holding power) applied to the mold 7 by being connected to a vacuum pump (not illustrated) that is arranged externally and suitably adjusting the suction pressure by the evacuation performed by this vacuum pump. The mold driving mechanism 12 moves the mold 7 in each axial direction so as to selectively carry out the pressing and separation between the mold 7 and the resin 9 on the wafer 10. For example, a linear motor and an air cylinder are drive sources that can be used in this mold drive mechanism. In addition, in order to accommodate the high precision positioning of the mold 7, the mold drive mechanism 12 may be configured by a plurality of drive systems, such as a coarse drive system and a fine drive system. Furthermore, the mold drive mechanism 12 can also be configured to include a position adjustment function for not only the Z axis direction, but also the X axis direction and the Y axis direction or the θ (rotation around the Z axis) direction, and a tilt function for correcting the tilt of the mold 7. Note that although the pressing and separating operations in the imprint apparatus 1 may also be realized by moving the mold 7 in the Z axis direction, this may also be realized by moving the wafer stage 4 in the Z axis direction or moving both relative to each other. In addition, although not illustrated, the position of the mold 7 during driving by the mold driving mechanism 12 can be measured by a position measuring unit such as an optical displacement gauge that measures the distance between the mold 7 and the wafer 10. The magnification correction mechanism is arranged in the mold chuck 11 on the holding side of the mold 7, and the form of the mold 7 (the pattern portion 7a) is corrected by mechanically applying an external force or a displacement to the side surface of the mold 7. Furthermore, the mold chuck 11 and the mold driving mechanism 12 include at the center portion (inside) of a plane direction an open area 13 through which the ultraviolet light 8 that has been irradiated from the light irradiation unit 2 can pass toward the wafer 10.

The wafer 10 is, for example, a single crystal silicon substrate, an SOI (Silicon on Insulator) substrate, or a glass substrate. A pattern (a layer including a pattern) of a resin 9 is molded by a pattern portion 7a in a plurality of pattern formation areas on the wafer 10 (before being conveyed into the imprint apparatus 1, a pattern (below, referred to as the "substrate-side pattern") has already been formed by a previous process).

The wafer stage 4 holds a wafer 10 so as to be movable, and, for example, carries out the alignment of the pattern portion 7a and the substrate-side pattern when the mold 7 and the resin 9 on the wafer 10 are pressed together and the like. The wafer stage 4 includes a wafer chuck 14 that holds a wafer 10 by a suction force, an auxiliary member 15 that is arranged so as to enclose the outer periphery of the wafer 10, and a stage drive mechanism 16 that mechanically holds the wafer chuck 14 and can move in each of the axial directions. The wafer chuck 14, for example, supports the wafer 10 by a plurality of pins having the same height and holds the wafer 10 by decreasing the pressure at the portion outside the pins by evacuation. The auxiliary member 15 has a surface height equal to that of the wafer 10 that has been mounted on the wafer chuck 14, and this is used in order to make uniform the thickness of the resin pattern at the outer peripheral end portion of the wafer 10. The stage drive mechanism 16 is a drive source having little vibration during driving or while stationary, and, for example, a linear motor or a plane motor and the like are drive sources that can be used. This stage drive mechanism 16 can also be configured with respect to each of the X axis and the Y axis directions by a plurality of drive systems such as a coarse drive system and a fine drive system. Furthermore, the stage drive mechanism 16 may be configured to include a drive system for position adjustment in the Z axis direction, a position adjustment function for position adjustment in a θ direction of the wafer 10, and a tilt function for correcting the tilt of the wafer 10. At the same time, the wafer stage 4 is provided with a plurality of reference mirrors 17 corresponding to each of the X, Y, Z, ωx, ωy, and ωz directions on the side surface thereof. In contrast, the imprint apparatus 1 is provided with a plurality of laser interferometers (position measurement devices) 18 that measure the position of the wafer stage 4 by irradiating beams such as helium neon onto these reference mirrors 17. Note that in FIG. 1, only one set of a reference mirror 17 and a laser interferometer 18 are illustrated. The laser interferometers 18 measure the position of the wafer stage 4 in real time, and a controller 6, described below, implements the positioning control of the wafer 10 (wafer stage 4) based on the measured values at this time. Note that in addition to the interferometer for measuring range described above, an encoder and the like that uses a semiconductor laser can be used as position measurement devices.

The dispenser 5 is arranged in proximity to the mold holding mechanism 3, and resin (uncured resin) 9 is applied to a shot (substrate-side pattern), which is a pattern forming area present on the wafer 10. This resin 9 is ultraviolet light-cured resin (photo-cured resin, imprint material) having a property of being cured by being exposed to ultraviolet light 8, and is suitably selected depending on various conditions such as the semiconductor device manufacturing steps and the like. This dispenser 5 uses an inkjet method as an application method, and includes a vessel 19 that contains the resin 9 in an uncured state and a drop ejecting unit 20. The vessel 19 preferably enables management of the resin 9 while the interior thereof has air that includes, for example, a small amount of oxygen so that a curing reaction of the resin 9 does not occur. In addition, the material of the vessel 19 preferably does not allow mixing of particles or chemical impurities into the resin 9. The drop ejecting unit 20 includes, for example, a piezo-type ejecting mechanism (inkjet head) that includes a plurality of ejection ports. The applied amount (ejection amount) of the resin 9 can be adjusted in a range of 0.1 to 10 pL/drop, and normally, about 2 pL/drop is used. Note that the total applied amount of the resin 9 is determined by the density of the pattern portion 7a and the desired remaining film thickness. The dispenser 5 applies by dispersion the resin 9 on the shot as drops (drops 32 explained below) and controls the application position and application amount and the like based on operation commands from the controller 6.

Figures 3A, 3B:
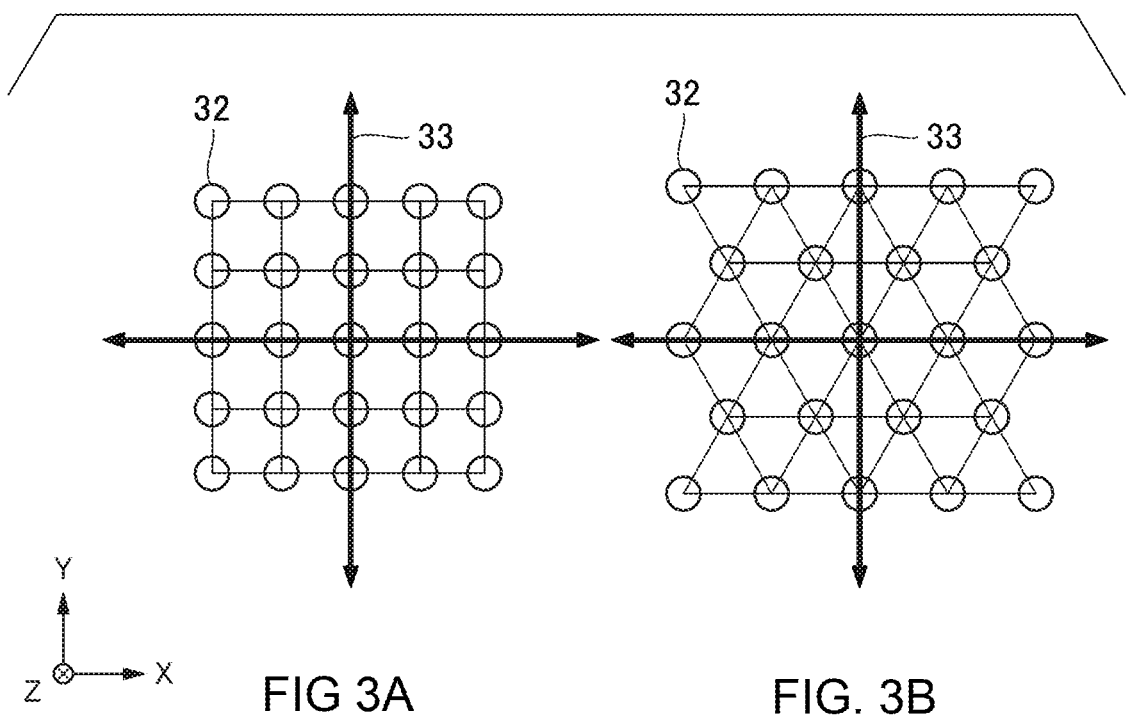
FIGS. 3A and 3B are drawings that show an example of the disposition of drops that are applied to a shot.

Here, as a reference, an example of the disposition of drops of resin 9 that the dispenser 5 can apply on a shot will be explained. FIGS. 3A and 3B are schematic plan views that show an example of the disposition of the drops 32 on a shot. In particular, FIG. 3A shows an example in which the drops 32 are disposed in a square lattice form (a rectangular lattice form), while in contrast, FIG. 3B shows an example in which the drops 32 are disposed in a triangular lattice form. Specifically, in both FIG. 3A and FIG. 3B, the drops 32 are arrayed in a polygonal lattice form. In the case of the drops 32 that are disposed as shown in FIG. 3A, the array direction 33 of the drops 32 coincides with the X axis and Y axis directions. Here, the term "array direction" denotes the direction of a line connecting adjacent drops at the shortest distance in a plan view of the substrate viewed from directly above. In contrast, in the case in which drops 32 are disposed as shown in FIG. 3B, the array direction 33 is parallel to X axis direction and can be understood to be parallel to the Y axis direction.

The controller 6 can control the operation and adjustment and the like of each of the components of the imprint apparatus 1. The controller 6 is configured, for example, by a computer and the like, is connected via circuits to each component of the imprint apparatus 1, and can execute the control of each of the components according to a program and the like. The controller 6 of the present embodiment at least controls the operation of the dispenser 5, the wafer stage 4 and a rotation mechanism, which is described below. Note that the controller 6 may be configured integrally (housed inside a shared case) with the other portions of the imprint apparatus 1, or may be configured as a separate unit (housed in a separate case) separately from the other portions of the imprint apparatus 1.

In addition, the imprint apparatus 1 is provided with an alignment measuring system 21 that measures alignment marks that are formed on the wafer 10. In addition, the imprint apparatus 1 is provided with a platen 22 on which the wafer stage 4 is mounted and that forms a reference plane, a bridge platen 23 that attaches the mold holding mechanism 3, and a support column 25 that extends from the platen 22 and supports the bridge platen 23 via a vibration isolator 24 that eliminates vibrations from the floor. Furthermore, although not illustrated, the imprint apparatus 1 can include a mold conveying mechanism that conveys a mold 7 between the outside of the apparatus and the mold holding mechanism 3 and a substrate conveying mechanism that conveys a wafer 10 between the outside of the apparatus and the wafer stage 4.

Next, the imprint method (imprint processing) by the imprint apparatus 1 will be explained. First, the controller 6 mounts and attaches the wafer 10 to the wafer stage 4 by using a substrate conveying apparatus. Next, the controller 6 sequentially measures alignment marks on the wafer 10 by using an alignment measuring system 21 while suitably changing the position of the wafer 10 by driving the stage drive mechanism 16, and detects the position of the wafer 10 with high precision. In addition, the controller 6 calculates each of the transfer coordinates based on the results of this detection, and forms patterns one by one for each predetermined shot based on the results of these calculations (step and repeat). As a flow of pattern formation on one certain shot, the controller 6 first positions the application position (a specific position on the shot) on the wafer 10 below the ejection port of the drop ejection unit 20 by using the stage drive mechanism 16. Subsequently, the dispenser 5 applies a resin 9 to the shot on the wafer 10 (the application step). Next, the controller 6 moves and positions the wafer 10 such that the shot is positioned at the pressing position directly under the pattern portion 7a by using the stage drive mechanism 16. Next, after implementing the position alignment of the pattern portion 7a and the substrate-side pattern on the shot and the magnification correction of the pattern portion 7a by the magnification correction mechanism, the controller 6 drives the mold drive mechanism 12 and presses the pattern portion 7a onto the resin 9 on the shot (mold pressing step). Due to this pressing, the resin 9 fills the contoured pattern of the pattern portion 7a. Note that the controller 6 carries out the determination of the pressing completion by using a load sensor (not illustrated) that is arranged in the interior of the mold holding mechanism 3. In this state, the light irradiating unit 2 irradiates ultraviolet light 8 for a predetermined time from the back surface (upper surface) of the mold 7, which serves as a curing step, and the resin 9 is cured by the ultraviolet light 8 that has passed through the mold 7. In addition, after the resin 9 has been cured, the controller 6 drives the mold drive mechanism 12 again, and separates the pattern portion 7a from the wafer 10 (mold separation step). Thereby, on the surface of the shot of the wafer 10, a three-dimensional resin pattern (layer) is formed that conforms to the contoured pattern of the pattern portion 7a. The imprint apparatus 1 can form a plurality of resin patterns on one wafer 10 by executing such a series of imprint operations a plurality of times while changing the shot by driving the wafer stage 4.

Here, in the application step, the dispenser 5 implements the application of the resin 9 on the shot by ejecting a plurality of drops of the resin 9 as described above. Below, the disposition of the drops in the present embodiment on the shots at this time will be explained. First, for comparison, the case of a conventional imprint apparatus will be explained. FIGS. 4A and 4B are schematic plan views that show the form of a contoured pattern 30 that has been formed by the pattern portion 7a of the mold 7 and the conventional disposition of drops of resin 9 that are applied to a shot on this contoured pattern 30. Note that, as shown in FIG. 4A, the form of the contoured pattern 30 in this case is identical to the form of the contoured pattern 30a that is illustrated in FIG. 2A. In a conventional imprint apparatus, as shown in FIG. 4B, the disposition of drops 32 on a shot is a square lattice form.

FIG. 5A and FIG. 5B are plan views that show the filling behavior of a one certain drop 32 with respect to the contoured pattern 30 when the pattern portion 7a and the resin 9 that has been applied to a shot are pressed together. As shown in FIG. 5A, when the pattern portion 7a comes into contact with the drop 32 on the shot, the drop 32 gradually spreads as shown in FIG. 5B. At this time, the drop 32 readily spreads along the principal axis direction 31 with little resistance, and in a direction that is perpendicular to the principal axis direction 31, the drop 32 does not readily spread because the drop must pass over the convex portions. Therefore, this drop 32 fills into the contoured pattern 30 while the spreading form of the drop 32 forms an elliptical that is long in the principal axis direction 31 and that is short in the direction perpendicular thereto.

Figures 6A, 6B, 6C:
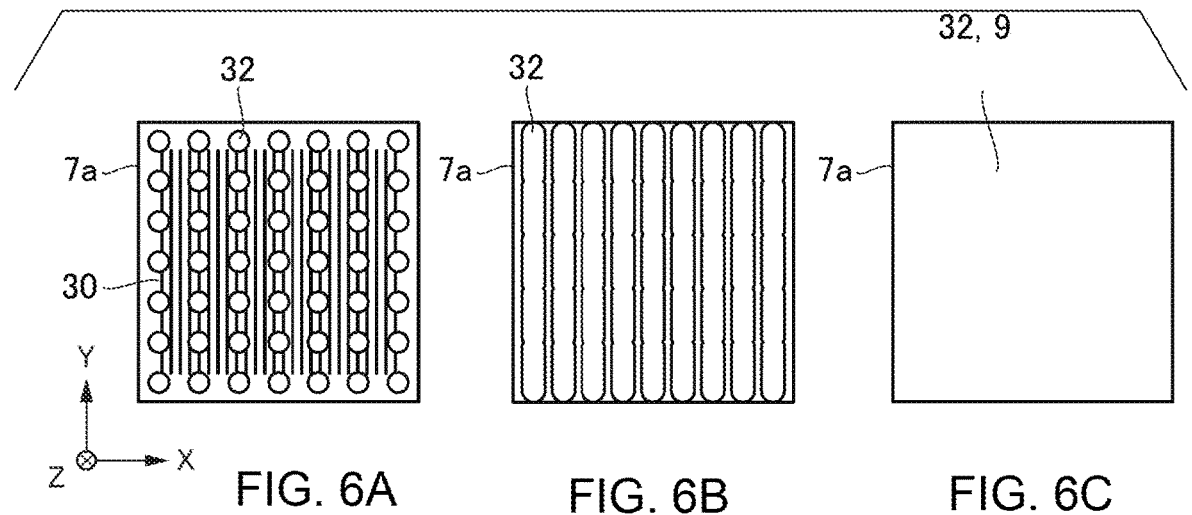
FIG. 6A to 6C are drawings that show the conventional filling behavior of drops that are disposed over the entire shot.

With reference to the filling behavior that is shown in FIG. 5A and FIG. 5B, FIG. 6A to FIG. 6C are schematic plan views for explaining the filling behavior of the drops 32 on the contoured pattern 30 when the drops 32 are disposed on all of the shots as shown in FIG. 4B. As shown in FIG. 6A, when the pattern portion 7a is brought into contact with the drops 32 on the shot, as shown in FIG. 6B, first each of the drops 32 come into contact with adjacent drops in the principal axis direction 31, and are merged into one row in this direction. Subsequently, each of the drops 32 (resin 9) are also brought into contact with adjacent drops (drop row) in the direction that is perpendicular to the principal axis direction 31, and as shown in FIG. 6C, finally the drops 32 spread over the entire surface of the contoured pattern 30. Specifically, in a conventional imprint apparatus, when the pattern portion 7a and the resin 9 on the shot are pressed together, the time during which the drops spread in the direction perpendicular to the principal axis direction 31 is longer than the time during which the drops 32 spread in the principal axis direction 31. This spreading time becoming longer is related to the pressing time itself becoming long, and as a result, the throughput, that is, the productivity, is influenced. Note that in FIG. 4A to FIG. 6C, the width of the recessed portions of the contoured pattern 30 is shown enlarged to facilitate explanation. As explained above, the pattern size (groove width) of the contoured pattern 30 is extremely fine. Generally, the pattern size is 100 nm or less, whereas in contrast, the application gap between drops 32 is from tens to hundreds of μm, and the application gaps of the drops 32 are larger than the pattern side.

Figure 7:
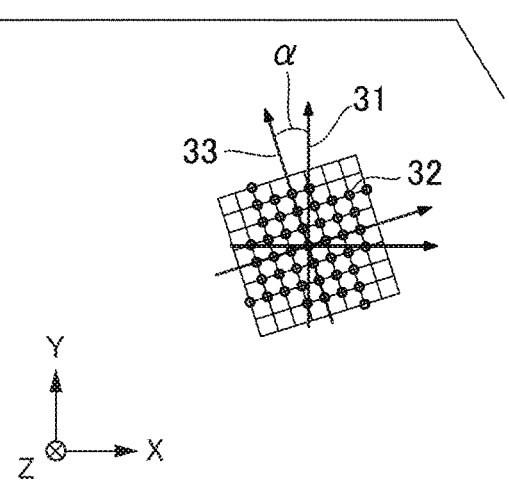
FIG. 7 is a drawing that shows the disposition of drops in the first embodiment.

In contrast, in the present embodiment, the spreading time of the drops 32 during pressing between the pattern portion 7a and the resin 9 on the shot is shortened by changing (tilting) the angle of the disposition of the drops of the resin 9 applied to the shot from the conventional disposition that is shown in FIG. 6A. FIG. 7 is a schematic plan view that shows the disposition of the drops 32 of the resin 9 that are applied to the shot in the present embodiment. Note that for comparison with the conventional case, the form of the contoured pattern 30 is identical to the form that is shown in FIG. 4A. In the conventional imprint apparatus, the principal axis direction 31 of the contoured pattern 30 coincides with the array direction 33 of the drops 32 on a shot. In contrast, as shown in FIG. 7, the disposition of each of the drops 32 in the present embodiment is set such that the principal axis direction 31 and the array direction 33 define an acute angle while the disposition form (application gap) itself, similar to a conventional form, have a square lattice form.

FIG. 8 is a schematic plan view for explaining the decision method for the angle α when the array direction 33 is tilted as shown in FIG. 7. Note that in FIG. 8A and FIG. 8B, six arbitrary drops 32, which are disposed adjacent to each other, are extracted and shown. First, as shown in FIG. 8A, the controller 6 assumes that an array direction 33 having an arbitrary angle is tilted and that there is a band 34 having a width that is identical to the radius of an arbitrary drop 32a along the principal axis 31. Next, the controller 6 sets the drops 32 that are in n rows of an array direction 33 at which the drops 32a are present and n+1 rows adjacent to these n rows and that overlap the band 34 respectively to first drops (first resin) 32*b* and second drops (second resin) 32*c*. Note that "n" is an integral number. Here, as shown in FIG. 8B, the radius of a drop 32 is denoted by r, the application gap between drops 32 is denoted by D, the gaps between the drops 32*a* and the second drops 32*c* in the principal axis direction 31 are denoted by L, and the angle defined by the drops 32*a* and the second drops 32*c* is denoted by β. In this context, the controller 6 may determine the angle α (defined angle α) in addition to the amount of the drops 32 and the application gaps so as to satisfy the conditions of the following equation (1) and equation (2).

$$D(\sin \alpha) \leq 2r \quad (1)$$

$$L(\tan \beta) \leq 2r \quad (2)$$

FIG. 9 is a schematic plan view for explaining the filling behavior of the six drops 32, shown in FIG. 8, on the contoured pattern 30. The drops 32*a* are brought into contact with the adjacent drops 32*b* in row n, as shown in FIG. 9A, immediately after the start of the pressing. In addition, as the pressing further progresses, the drops 32*a* spread further along the principal axis direction 31, and as shown in FIG. 9B, among the drops 32 in row n+1, the drops 32*a* are brought into contact with drops 32*c*, which are most adjacent in the direction that is perpendicular to the principal axis direction 31. Specifically, when considering the direction that is perpendicular to the principal axis direction 31, in the conventional disposition of the drops 32, in order to bring the drops 32 that are present in row n and row n+1 into contact, this takes time because the drops must pass over the convex portions therebetween. However, it is understood that in the present embodiment, they are brought into contact in a short time.

Figures 10A, 10B:
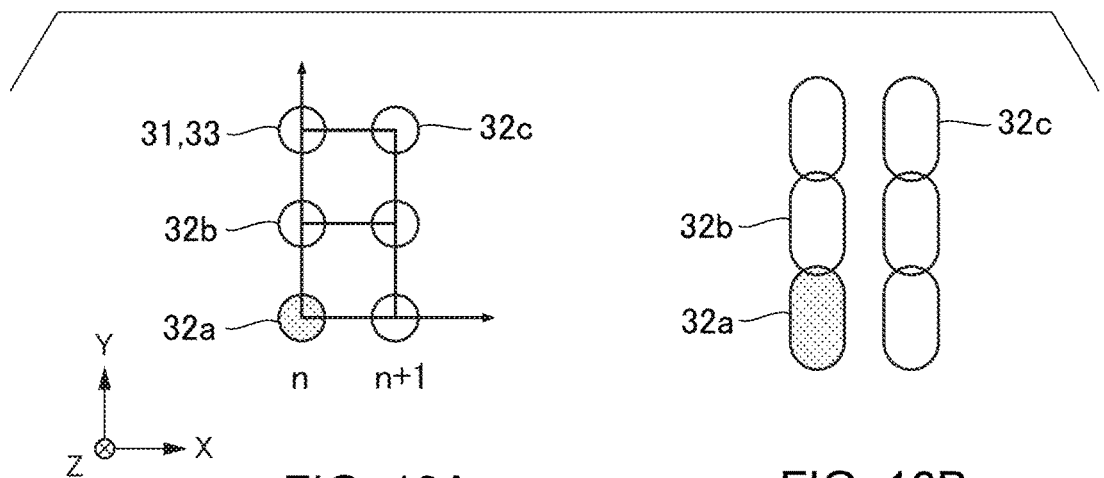
FIGS. 10A and 10B are drawings that show the conventional filling behavior of six drops.

For a comparison, FIG. 10A and FIG. 10B are schematic plan views for explaining the filling behavior of six drops 32 in the conventional case in FIG. 9. As shown in FIG. 10A, in the conventional disposition of drops 32, the principal axis direction 31 of the contoured pattern 30 coincides with the array direction 33 of the drops 32 on the shot. Therefore, as shown in FIG. 10B, although the drops 32*a* spread in a short time in the principal axis direction 31 to come into contact with the drops 32*b*, the gaps between the drops 32 of row n+1 do not become filled in the direction that is perpendicular to the principal axis direction 31, and more time is required until these gaps become filled.

Figures 11A, 11B, 11C:
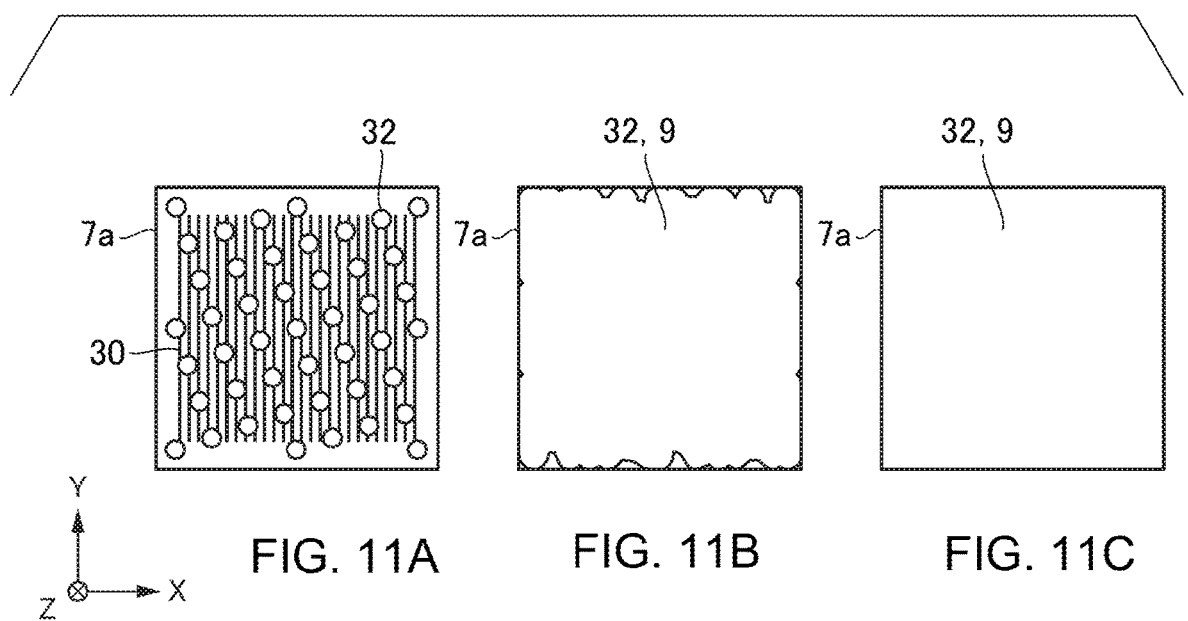
FIG. 11A to 11C are drawings that show the filling behavior of drops in the first embodiment.

FIGS. 11A, 11B, and 11C are schematic plan views for explaining the filling behavior of drops 32 in the contoured pattern 30 when the disposition of the drops 32 on the shot is set as shown in FIG. 7 and the drops 32 are disposed on all of the shots. As shown in FIG. 11A, when the pattern portion 7*a* comes into contact with the drops 32 on a shot, as shown in FIG. 11B, each of the drops 32 (resin 9) come into contact with an adjacent drop in the principal axis direction 31, and at the same time, contact between adjacent drops in a direction that is perpendicular to the principal axis direction 31 also begins. In addition, after each of the drops 32 (resin 9) have spread in a short time in this manner, as shown in FIG. 11C, finally the drops 32 spread over the entire surface of the contoured pattern 30.

Next, the operation of the imprint apparatus 1 when changing the angle α of the array direction 33 with respect to the principal axis direction 31, as described above, will be explained. FIGS. 12A, 12B, and 12C are schematic plan views that show the application operation of the resin 9 on a shot of a general-use wafer 10 in a time sequence. In the application step, the controller 6 first, as shown in FIG. 12A, moves the wafer 10 to a position at which an inkjet head 40 that forms the drop ejection unit 20 of the dispenser 5 faces the desired shot on the wafer 10 by using the stage drive mechanism 16. Next, as shown in FIG. 12B, the controller 6 directs the dispenser 5 to apply in sequence drops 32 of resin 9 from the inkjet head 40 onto the shot while scanning the wafer 10 in a stage scanning direction 41 (the X axis direction) by using the stage moving mechanism 16 again. In addition, as shown in FIG. 12C, the controller 6 applies the drops 32 in a desired disposition on a shot and completes the application operation.

In connection with the application operation that is shown in FIG. 12, for example, an application disposition of the drops 32 of the present embodiment can be realized by using a method such as the one described below. FIG. 13A to FIG. 13F are schematic plan views that show a plurality of examples of the application operation of drops 32 in the present embodiment. First, in a first example that is shown in FIG. 13A, the controller 6, similar to the conventional method, disposes an inkjet head 40 parallel to the Y axis direction, and while scanning the wafer 10 in the stage scan direction 41 (the X axis direction), drops 32 are applied from the inkjet head 40 onto a shot. At this time, taking into consideration that the mold 7 will be subsequently rotated, the controller 6 suitably selects an ejection port of the inkjet head 40 in the dispenser 5, and carries out control such that the application positions of the drops 32 are confined within the range of the contoured pattern 30. Note that as a mechanism that rotates the mold 7, a mold driving mechanism 12 may be used, or a rotation mechanism that can rotate the mold 7 centered on the direction (the Z axis direction) that presses into the mold holding mechanism 3 may be arranged separately and used. Subsequently, the controller 6 rotates the mold 7 using the rotation mechanism described above so as to tilt by an angle α using the center portion of the shot surface as a reference. Next, in a second example that is shown in FIG. 13B and FIG. 13C, as shown in FIG. 13B, the controller 6 rotates a wafer 10 by an angle α, and then applies drops 32 onto a shot from the inkjet head 40. Note that as a mechanism that rotates the wafer 10, the stage drive mechanism 16 may be used, or a rotation mechanism that can rotate the wafer centered on the direction that presses into the wafer stage 4 may be arranged separately and used. Subsequently, the controller 6 rotates the wafer 10 by using the rotation mechanism in this case, and the position of the wafer 10 is returned to the original position. Next, in a third example that is shown in FIG. 13D, the controller 6 tilts the inkjet head 40 by an angle α from the Y axis direction, then scans after tilting the stage scan direction 41 by an angle α from the X axis direction, and applies the drops 32 from the inkjet head 40 onto the shot. In this case, the rotation mechanism is arranged separately on the inkjet head 40 so as to integrally rotate a plurality of ejection ports that are arranged in the array direction. Next, in a fourth example that is shown in FIG. 13E, the inkjet head 40 includes ejection ports that are formed more closely than conventionally, and scanning in the Y axis direction becomes possible by using a drive mechanism (not illustrated). Then, the controller 6 scans the wafer 10 in the stage scan direction 41 while suitably selecting an ejection port of the inkjet head 40 in the dispenser 5, and applies drops 32 onto the shot. In addition, in a fifth example that is shown in FIG. 13F, the inkjet head 40, similar to the inkjet head 40 that is shown in FIG. 13D, is tilted by an angle α from the Y axis direction, and similar to the inkjet head 40 that is shown in FIG. 13E, scanning in the Y axis direction becomes possible. Then, while tilting the inkjet head 40 by an angle α from the Y axis direction, the controller 6 scans the wafer 10 in the stage scan direction 41 while scanning in the Y axis direction, and applies the drops 32 onto the shot. Note that in addition to these illustrations, a case can also be considered in which, for example, instead of the scanning movement of the wafer stage 4, the inkjet head 40 itself undergoes scanning movement above the wafer 10.

In the application step of the present embodiment, in addition to an application amount that is applied to a shot, as explained above, the setting of a principal axis direction 31 and an angle α of the array direction 33 with respect to this principal axis direction 31 are determined in advance, and the resin 9 is applied to the dispenser 5 based on this information. Here, in particular, the controller 6 may obtain pattern data for this resin pattern to be formed on a shot and determine the setting of the principal axis direction 31 in advance based on this pattern data, or a user may input in this setting in advance into the controller 6 as an initial setting.

In this manner, the imprint apparatus 1 can shorten the spreading time of the drops 32 in a direction that is, in particular, perpendicular to the principal axis direction 31 during the pressing of the pattern portion 7a and the resin 9 on the shot, and thereby, as a result, the throughput can be hastened and the productivity can be increased. In particular, in the present embodiment, simply by changing the angle of the application disposition of the drops 32, the total application amount of the resin 9 that is applied to a shot does not change from the conventional amount. That is, the uniformity of the remaining film thickness of the resin pattern of the drops 32 that are formed on the wafer 10 (shot) can be realized directly, and the occurrence of portions of the contoured pattern 30 not filled by resin 9 during pressing can be suppressed.

As explained above, according to the present embodiment, an imprint apparatus and method can be provided that is advantageous in enabling the suppression of the occurrence of portions of the contoured pattern of the mold that are not filled by resin and increasing the throughput.

Second Embodiment

Next, an imprint apparatus according to a second embodiment of the present invention will be explained. The feature of the imprint apparatus of the present embodiment is the point that the disposition of the drops 32 of the resin 9 that are applied to the shot on the wafer 10 is changed from the case of the first embodiment when the contoured pattern 30 comprises a plurality of partial areas that have differing pattern densities. FIG. 14A to FIG. 14D are schematic plan views that show the form of the contoured pattern 30 present in a plurality of partial areas of the mold 7 in the present invention that are formed by the pattern portion 7a, and the disposition of drops 32 of resin 9 that are applied to a shot on the wafer 10 with respect to this contoured pattern 30. Serving as one example, as shown in FIG. 14A and FIG. 14B, two contoured patterns 30, that is, the first contoured pattern $30f_1$ and the second contoured pattern $30f_2$, are present in the pattern portion 7a. The pattern size of the first contoured pattern $30f_1$ is more course than the pattern size of the second contoured pattern $30f_2$, and the respective principal axis directions are both the Y axis direction.

Here, in the case in which a plurality of contoured patterns 30 are present in the pattern portion 7a, consideration is necessary for making the remaining film thickness of the resin 9 uniform when the drops 32 have spread over the entire surface of the pattern portion 7a during pressing. For example, when the application density of the drops 32 on the plurality of contoured patterns 30 having different pattern densities is the same, there is a high possibility that unevenness in the remaining film thickness will occur. Thus, in the present embodiment, the controller 6 makes the application density of the drops 32 on the respective contoured patterns 30 different in advance. In addition, on the plurality of contoured patterns 30 having respectively different pattern densities, the spreading rate of the drops 32 in the principal axis direction 31 and the direction perpendicular to this differs. Thus, as shown in FIGS. 14C and 14D, the controller 6 suitably adjusts in advance the respectively differing angles α ($α_1$, $α_2$) when the array direction 33 is tilted with respect to the principal axis direction 31 of the two contoured patterns $30f_1$ and $30f_2$. In this manner, according to the present embodiment, even in the case in which the contoured pattern 30 consists of a plurality of contoured patterns having differing pattern densities, an effect that is identical to that of the first embodiment is exhibited. Note that at the boundary area between the first contoured pattern $30f_1$ and the second contoured pattern $30f_2$, a dummy pattern may be arranged in a range that does not influence the actual article (that is, the circuit operation) in order to avoid being unable to form a uniform remaining film thickness on the entire surface of the pattern portion 7a due to mismatching.

Figure 15:
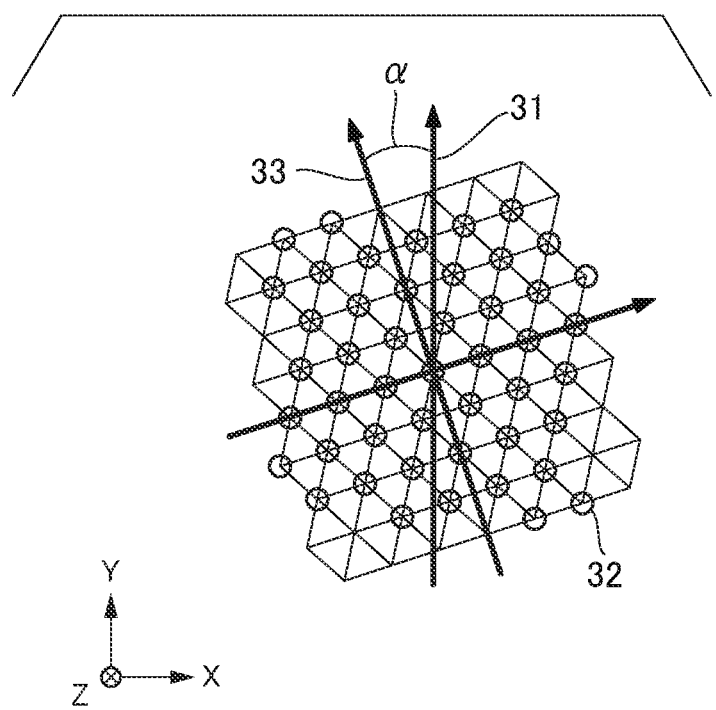
FIG. 15 is a drawing that shows the disposition of drops in another embodiment.

Note that in the present embodiment, an explanation has been provided in which the disposition of the drops 32 of resin 9 that are applied to a shot on the wafer 10 is a square lattice form, as shown in FIG. 3A. However, the present invention can also applied if the disposition of drops 32 has a triangular lattice form, as shown in FIG. 3B. In this case as well, as shown in FIG. 15, an effect that is identical to that of the above embodiment is exhibited by setting an array direction 33 that has an angle α with respect to the principal axis direction 31.

Note that in each of the above embodiment, an imprint apparatus and an imprint method that use photo-curing have been described. Even if the step in which a resin is cured by irradiating light is changed to a step using heat curing, in which a resin is cured by applying heat, the operation and effects of the present invention are identical. That is, the present invention can also be applied to a heat curing method.

(Article Manufacturing Method)

A method for manufacturing a device (semiconductor integrated circuit element, liquid crystal display element, or the like) as an article may include a step of forming a pattern onto a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-146018 filed on Jul. 12, 2013, which is hereby incorporated by reference herein in its entirety.

What is claimed is:

1. An imprint method comprising:
applying a plurality of drops on a substrate using a plurality of ejection ports of a dispenser;
bringing the plurality of drops and a contoured pattern of a mold into contact in a state that an array direction of the plurality of drops actually aligned on the substrate by the plurality of ejection ports is angled with respect to a principal axis direction of the contoured pattern; and
transferring the contoured pattern of the mold onto the substrate,
wherein the array direction is a direction of a line connecting adjacent drops at the shortest distance in a plan view of the substrate viewed from directly above; and
wherein the contoured pattern has recessed portions extending along a length direction, the recessed portions having a length in the length direction longer than a length in a width direction perpendicular to the length direction, and the principal axis direction is parallel to the length direction of recessed portions of the contoured pattern,
wherein the contoured pattern of the mold includes a first contoured pattern and a second contoured pattern having a different pattern density from the first contoured pattern, and
wherein, in the bringing:
the first contoured pattern of the mold contacts a first plurality of drops on the substrate by a first angle between the array direction of the first plurality of drops and the principal axis direction of the first contoured pattern,
the second contoured pattern of the mold having the different pattern density from the first contoured pattern contacts a second plurality of drops on the substrate by a second angle between the array direction of the second plurality of drops and the principal axis direction of the second contoured pattern, and
the first angle and the second angle differ from each other according to pattern densities of the first contoured pattern and the second contoured pattern.

2. The imprint method according to claim 1, wherein the array direction is angled with respect to the principal axis direction by rotating the plurality of ejection ports of the dispenser.

3. The imprint method according to claim 1, wherein the plurality of resin drops are disposed in a polygonal lattice form on the substrate.

4. The imprint method according to claim 1, further comprising acquiring pattern data for the contoured pattern of the mold and determining the principal axis direction based on the pattern data,
wherein, in the bringing, the plurality of drops and the contoured pattern of the mold are brought into contact with each other based on the determined principal axis direction.

5. The imprint method according to claim 1, wherein the principal axis direction and the array direction form an acute angle.

6. The imprint method according to claim 1, wherein the array direction is tilted and that there is a band having a width of a radius of an arbitrary resin drop along the principal axis, and when any arbitrary number of resin drops are in arbitrary n rows (where n is an integer) of the array direction at which arbitrary resin drops are present and in n+1 rows adjacent to these n rows and that overlap the band are determined respectively to be first resin drops and second resin drops, and when the radius of the resin drop is r, the application distances between resin drop is D, the gap in the principal axis direction between the arbitrary resin drop and a second resin drop is L, the angle between the principal axis direction and the array direction is α, and the angle between the principal axis direction and a straight line connecting the arbitrary resin drop and the second resin drop is β, then the angle α is determined so as to satisfy the following conditions:

$$D(\sin \alpha) \leq 2r, \alpha > 0°, \text{ and}$$

$$L(\tan \beta) \leq 2r.$$

7. The imprint method according to claim 1, wherein the principal axis direction with respect to each of the plurality of partial areas in an area to which the contoured pattern is to be transferred is set, and the array direction are determined based on the principal axis direction for each partial area.

8. An article manufacturing method comprising:
forming a pattern on a substrate using an imprint apparatus; and
processing the substrate on which the pattern has been formed in the forming to obtain the article from the processed substrate,
the forming comprising:
applying a plurality of drops on a substrate using a plurality of ejection ports of a dispenser;
bringing the plurality of drops and a contoured pattern of a mold into contact in a state that an array direction of the plurality of drops actually aligned on the substrate by the plurality of ejection ports is angled with respect to a principal axis direction of the contoured pattern; and
transferring the contoured pattern of the mold onto the substrate,
wherein the array direction is a direction of a line connecting adjacent drops at the shortest distance in a plan view of the substrate viewed from directly above; and
wherein the contoured pattern has recessed portions extending along a length direction, the recessed portions having a length in the length direction longer than a length in a width direction perpendicular to the length direction, and the principal axis direction is parallel to the length direction of recessed portions of the contoured pattern,
wherein the contoured pattern of the mold includes a first contoured pattern and a second contoured pattern having a different pattern density from the first contoured pattern, and
wherein, in the bringing:
the first contoured pattern of the mold contacts a first plurality of drops on the substrate by a first angle between the array direction of the first plurality of drops and the principal axis direction of the first contoured pattern,
the second contoured pattern of the mold having the different pattern density from the first contoured pattern contacts a second plurality of drops on the substrate by a second angle between the array direction of the second plurality of drops and the principal axis direction of the second contoured pattern, and the first angle and the second angle differ from each other according to pattern densities of the first contoured pattern and the second contoured pattern.

\* \* \* \* \*